United States Patent
Kim et al.

(10) Patent No.: US 9,320,137 B2
(45) Date of Patent: Apr. 19, 2016

(54) PRINTED CIRCUIT BOARD AND METHOD FOR MANUFACTURING THE SAME

(75) Inventors: Dong Wan Kim, Seoul (KR); Tae Ho Kim, Seoul (KR); Il Sang Maeng, Seoul (KR); Song Hee Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/125,238

(22) PCT Filed: Jun. 11, 2012

(86) PCT No.: PCT/KR2012/004607
§ 371 (c)(1),
(2), (4) Date: Mar. 7, 2014

(87) PCT Pub. No.: WO2012/169866
PCT Pub. Date: Dec. 13, 2012

(65) Prior Publication Data
US 2014/0202743 A1 Jul. 24, 2014

(30) Foreign Application Priority Data
Jun. 10, 2011 (KR) ........................ 10-2011-0056536

(51) Int. Cl.
| H05K 1/00 | (2006.01) |
| H05K 1/02 | (2006.01) |
| H05K 1/18 | (2006.01) |
| H05K 3/46 | (2006.01) |

(52) U.S. Cl.
CPC ............... *H05K 1/028* (2013.01); *H05K 1/188* (2013.01); *H05K 3/4691* (2013.01); *H05K 3/4652* (2013.01); *H05K 2201/10636* (2013.01); *H05K 2203/063* (2013.01); *Y02P 70/611* (2015.11)

(58) Field of Classification Search
CPC ..... H05K 1/148; H05K 3/4691; H05K 1/188; H05K 1/028; H05K 3/4652; H05K 2201/10636; H05K 2203/063
See application file for complete search history.

(56) References Cited

U.S. PATENT DOCUMENTS

| 4,338,149 A * | 7/1982 | Quaschner ................... 156/248 |
| 2008/0047737 A1* | 2/2008 | Sahara et al. ................. 174/254 |
| 2009/0229876 A1* | 9/2009 | Takahashi ..................... 174/378 |
| 2010/0025087 A1* | 2/2010 | Takahashi ............ H05K 3/4691 174/254 |
| 2011/0135248 A1* | 6/2011 | Langer et al. ................... 385/14 |

FOREIGN PATENT DOCUMENTS

| KR | 10-2009-0022253 | 3/2009 |
| KR | 10-2010-0071083 | 6/2010 |
| KR | 10-2010-0095185 | 8/2010 |

(Continued)

OTHER PUBLICATIONS

International Search Report in International Application No. PCT/KR2012/004607, filed Jun. 11, 2012.

(Continued)

*Primary Examiner* — Steven T Sawyer
(74) *Attorney, Agent, or Firm* — Saliwanchik, Lloyd & Eisenschenk (57) ABSTRACT

Disclosed are a printed circuit board and a method for manufacturing the same. The printed circuit board includes a flexible substrate divided into first, second, and third regions, a first rigid substrate in the first region of the flexible substrate, and a second rigid substrate in the third region of the flexible substrate. The first and second substrates expose the second region of the flexible substrate.

8 Claims, 12 Drawing Sheets

(56) References Cited

FOREIGN PATENT DOCUMENTS

| | | |
|---|---|---|
| KR | 10-2010-0101000 | 9/2010 |
| TW | 200742520 A | 11/2007 |

OTHER PUBLICATIONS

Office Action dated Dec. 29, 2015 in Taiwanese Application No. 101120863.

* cited by examiner

PRINTED CIRCUIT BOARD AND METHOD FOR MANUFACTURING THE SAME

CROSS-REFERENCE TO RELATED APPLICATIONS

This application is the U.S. national stage application of International Patent Application No. PCT/KR2012/004607, filed Jun. 11, 2012, which claims priority to Korean Application No. 10-2011-0056536, filed Jun. 10, 2011, the disclosures of each of which are incorporated herein by reference in their entirety.

TECHNICAL FIELD

The present embodiment relates to a printed circuit board. In particular, the present embodiment relates to a printed circuit board capable of representing flexibility and a method for manufacturing the same.

BACKGROUND ART

In general, a printed circuit board (PCB) refers to a circuit board in which various kinds of parts are densely mounted on a flat plate made of phenol resin or epoxy resin, and curtailed circuits to connect the parts to each other are densely provided and fixed.

In this case, the PCB is manufactured in such a manner that a thin plate such as copper foil is attached to one side of a phenol resin insulating plate or an epoxy resin insulating plate, and etched (remaining portions except for circuits on a circuit line are corroded and thus removed) according to the interconnection pattern of circuits to form a desirable circuit, and the resulting structure is bored to mount parts therein.

In addition, the PCB is classified into a single-side PCB, a double-side PCB, and a multi-layer PCB according to the number of interconnection circuit surfaces. As the PCB has more many layers, the PCB represents the superior ability to mount parts so that the PCB having many layers is applied to high precision products.

The single-side PCB is mainly made of a phenol base substrate and applied to products, such as a radio set, a telephone, or a simple measurement instrument, the circuitry of which is not complicated.

In addition, the double-side PCB is mainly made of an epoxy resin base substrate, and applied to products, such as color TV sets, VTRs, or facsimiles, the circuitry of which is relatively complicated.

Furthermore, the multi-layer PCB is applied to highly precise apparatuses, such as at least 32 bit-computers, electronic switching systems, and high performance communication apparatuses.

Meanwhile, recently, as the electronic industry has been developed, a flexible PCB has been commercialized in order to flexibly cope with a case that a circuit plate must be moved similarly to automatic appliances or camcorders and a case that a circuit plate must be bent when inserting and constructing parts. In addition, various researches and studies on the flexible substrate capable of satisfying higher reliability have been performed.

DISCLOSURE OF INVENTION

Technical Problem

The present embodiment provides a printed circuit board having a novel structure.

Preferably, the present embodiment provides a rigid-flexible printed circuit board including a rigid region and a flexible region in a novel structure.

However, the disclosure is not limited to the above object, but those skilled in the art can obviously comprehend other objects from the following description.

Solution to Problem

According to the embodiment, there is provided a printed circuit board including a flexible substrate divided into first, second, and third regions, a first rigid substrate in the first region of the flexible substrate, and a second rigid substrate in the third region of the flexible substrate. The first and second substrates expose the second region of the flexible substrate.

According to the embodiment, there is provided a method for manufacturing a printed circuit board. The method includes preparing a flexible substrate divided into first, second, and third regions, forming a first rigid substrate to bury the first region on the first region and to expose the second and third regions, and forming a second rigid substrate to bury the third region on the third region of the flexible substrate and to expose the first and third regions. The first and second rigid substrates are formed to expose the second region of the flexible substrate.

Advantageous Effects of Invention

According to the present embodiment, the embedded printed circuit board and the flexible circuit board are integrally formed with each other as electronic products are reduced in size and thickness, so that the thickness of the printed circuit board manufactured in the final stage can be reduced.

In addition, according to the present embodiment, the flexible substrate having a cavity corresponding to the electronic device attached to the inner most part of the flexible substrate is manufactured, so that the manufacturing process of forming the flexible region can be simplified, and the following processes are not required. Accordingly, the present embodiment is applicable to mass production of the printed circuit board.

MODE FOR THE INVENTION

The embodiment of the disclosure will be described in detail with reference to accompanying drawings, so that those skilled in the art to which the disclosure pertains can easily realize the embodiment. However, the disclosure can be realized in various modifications, and is not limited to the embodiment.

In the following description, when a predetermined part "includes" a predetermined component, the predetermined part does not exclude other components, but may further include other components if there is a specific opposite description.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer (or film), a region, or a plate is referred to as being "on" or "under" another layer (or film), another region, or another plate, it can be "directly" or "indirectly" on the other layer (or film), region, plate, or one or more intervening layers may also be present. Such a position of the layer has been described with reference to the drawings.

Figure 1:
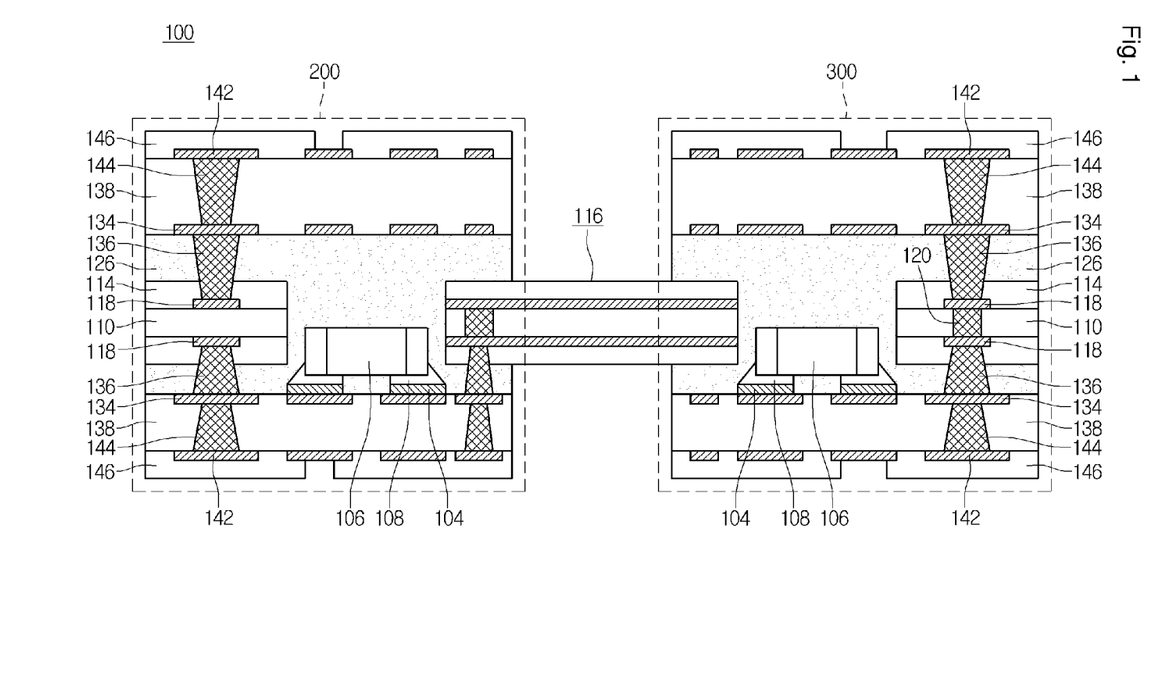
FIG. 1 is a sectional view showing a printed circuit board according to the embodiment of the disclosure.
Figure 2:
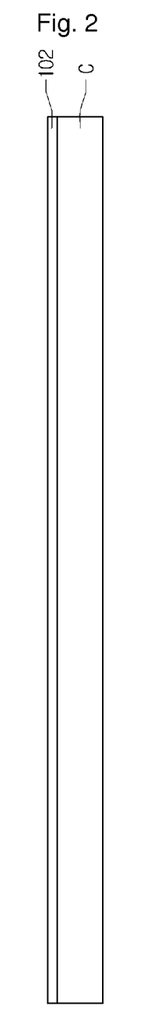
FIGS. 2 to 12 are sectional views a method for manufacturing the printed circuit board according to the embodiment of the disclosure in the process sequence.

FIG. 2 is a sectional view showing a printed circuit board according to the present embodiment.

Referring to FIG. 2, a printed circuit board 100 includes a flexible substrate 116, which has a flexible region A (see FIG. 7), a first rigid region B formed at a first side of the flexible region A, and a second rigid region C formed at a second side of the flexible region A, a first rigid substrate 200 exposing the flexible region A of the flexible substrate 116 and formed in the first rigid region B, and a second rigid substrate 300 exposing the flexible region A of the flexible substrate 116 and formed on the second region C.

Preferably, the flexible substrate 116 includes a polyimide layer 110, a first conductive layer 112 formed on top and bottom surfaces of the polyimide layer 110, and a first protective layer 114 formed on the top surface of the first conductive layer 112 to protect the first conductive layer 112.

Actually, the first conductive layer 112 corresponds to a first circuit pattern 118 provided in the flexible substrate 116. The first circuit pattern 118 may be formed by exposing/etching the first conductive layer 112 provided in the flexible substrate 116.

The first protective layer 114 may be a coverlay layer formed on the top surface of the first conductive layer 112 by an adhesive and protects the surface of the flexible substrate 116.

The polyimide layer 110 serves as an insulating material, and represents a superior flexibility. Accordingly, the degree of freedom in the design of the flexible region A is provided.

In this case, preferably, the flexible substrate 116 includes the polyimide layer 110. However, the present embodiment is not limited, and the flexible substrate 116 may include various insulating materials to represent the superior flexibility.

The flexible substrate 116 may be provided in the inner most part of the printed circuit board 100 according to the present embodiment.

A first rigid substrate 200 is formed in the first rigid region B of the flexible substrate 116, and a second rigid substrate 300 is formed in the second rigid region C.

In this case, each of the first and second rigid substrates 200 and 300 includes an insulating layer, conductive layers formed on the top and bottom surfaces of the insulating layer, and a protective layer formed on the top surface of the outer most conductive layer to protect the surface of the outer most conductive layer.

The insulating layer may include a first insulating layer 126 buried in the flexible substrate 116, and second insulating layers 138 formed on the top and bottom surfaces of the first insulating layer 126.

The first and second insulating layers 126 and 138 may include a thermoset polymer substrate, a thermoplastic polymer substrate, a ceramic substrate, an organic-inorganic hybrid substrate, or an impregnated fiberglass substrate. If the first and second insulating layers 126 and 138 include polymer resin, the first and second insulating layers 126 and 138 may include epoxy insulating resin. In addition, the first and second insulating layers 126 and 138 may include polyimide resin.

In this case, although the first and second insulating layers 126 and 138 may include the same materials, the elasticity of the first insulating layer 126 may be different from the elasticity of the second insulating layer 138 in order to minimize the stress transferred to the printed circuit board 100.

In addition, the first and second insulating layers 126 and 138 may have a structure in which a plurality of layers are laminated on each other.

For example, the first insulating layer 126 may include a structure surrounding an electronic device 106, that is, at least one insulating lamination group having an opening to expose the electronic device 106 and an upper insulating lamination group to cover the upper part of the insulating lamination group while exposing the flexible region A of the flexible substrate 116.

In addition, according to one embodiment, the first insulating layer 126 includes an impregnated substrate containing glass fiber, and the second insulating layer 138 may include an insulating sheet made of only resin.

The electronic device 106 is buried in the first insulating layer 126.

The electronic device 106 may be provided on the bottom surface thereof with a chip connector (not shown).

In detail, the electronic device 106 may include a passive device having a chip connector surrounding the lateral side of the passive device and an active device provided on the bottom surface thereof with a chip connector.

In this case, the electronic device 106 is attached to the inner part of the first insulating layer 126 by an adhesive paste 108 formed on a pad 104 and buried in the first insulating layer 126.

In addition, the flexible substrate 116 is formed at the lateral side of the electronic device 126. The flexible substrate 116 is provided therein with a cavity to receive the electronic device 126.

Second circuit patterns 134 are formed on the top and bottom surfaces of the first insulating layer 126.

Each second circuit patterns 134 is formed by etching a second metallic layer. The second circuit patterns 134 may include the alloy containing copper (Cu).

The first insulating layer 126 has a first connection part 136 which is formed by perforating a first surface of the first insulating layer 126 and a second surface opposite to the first surface to connect the first circuit pattern 118 to the second circuit pattern 134.

The second insulating layers 138 are formed on the top and bottom surfaces of the first insulating layer 126.

A third circuit pattern 142 is formed on a top surface of the second insulating layer 138, and a second protective layer 146 is formed on the third circuit pattern 142.

In addition, the second insulating layer 138 is formed therein with a second connection part 144 to electrically connect the second circuit pattern 134 to the third circuit pattern 142.

Although a description is made in that the insulating layer includes the first and second insulating layers 126 and 138, the insulating layer may include more many layers.

The detailed description of the printed circuit board 100 will be made in the description of a method for manufacturing the printed circuit board 100.

Hereinafter, the method for manufacturing the printed circuit board 100 having the above structure will be described.

FIGS. 2 to 11 are sectional views showing the method for the printed circuit board 100 in the process sequence.

As shown in FIG. 2, a carrier substrate C serving as a base when the printed circuit board 100 is manufactured is prepared.

The carrier substrate C is prepared to mount an electronic device thereon.

The carrier substrate C may include a thermoset polymer substrate, a thermoplastic polymer substrate, a ceramic substrate, an organic-inorganic hybrid substrate, or an impregnated fiberglass substrate. If the carrier substrate C includes polymer resin, the carrier substrate C may include epoxy insulating resin. In addition, the carrier substrate C may include polyimide resin.

A metallic layer 102 is formed on one surface of the carrier substrate C. The metallic layer 102 is used to form the second circuit pattern 134 thereafter.

The metallic layer 102 may be formed by performing an electroless plating process with respect to the carrier substrate C. In addition, the metallic layer 102 may be formed through a copper clad laminate (CCL) process.

When the metallic layer 102 is formed through the electroless plating scheme, light is applied to the top surface of the carrier substrate C, so that the electroless plating can be smoothly performed.

In addition, the metallic layer 102 may be formed on the carrier substrate C by interposing foam resin (not shown) between the carrier substrate C and the metallic layer 102. Accordingly, the carrier substrate C can be more easily separated from the metallic layer 102 by using the foam resin in the following process.

Figure 3:
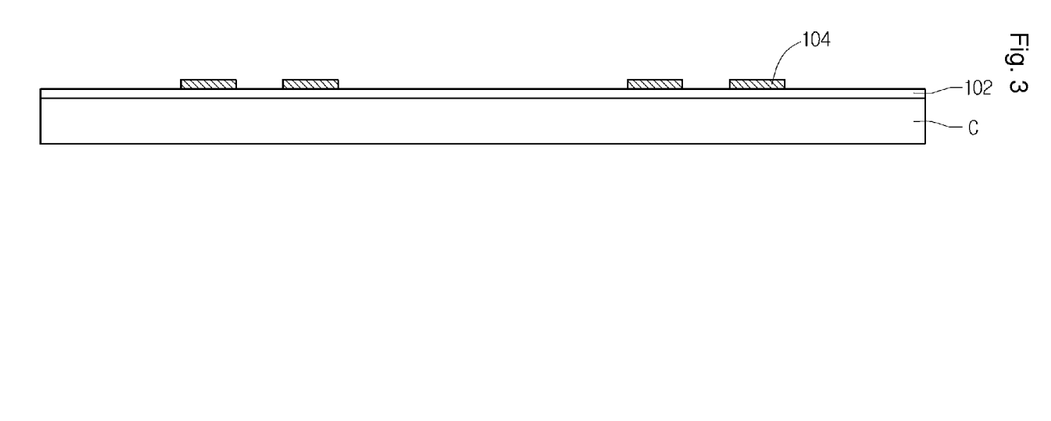

Thereafter, as shown in FIG. 3, the pad 104 is formed on the metallic layer 102 through an electroplating process employing the metallic layer 102 formed on the carrier substrate C as a seed layer.

The pad 104 may be formed by sequentially performing a dry film lamination process, an exposure and development process, a plating process, and a delamination process.

Figure 4:
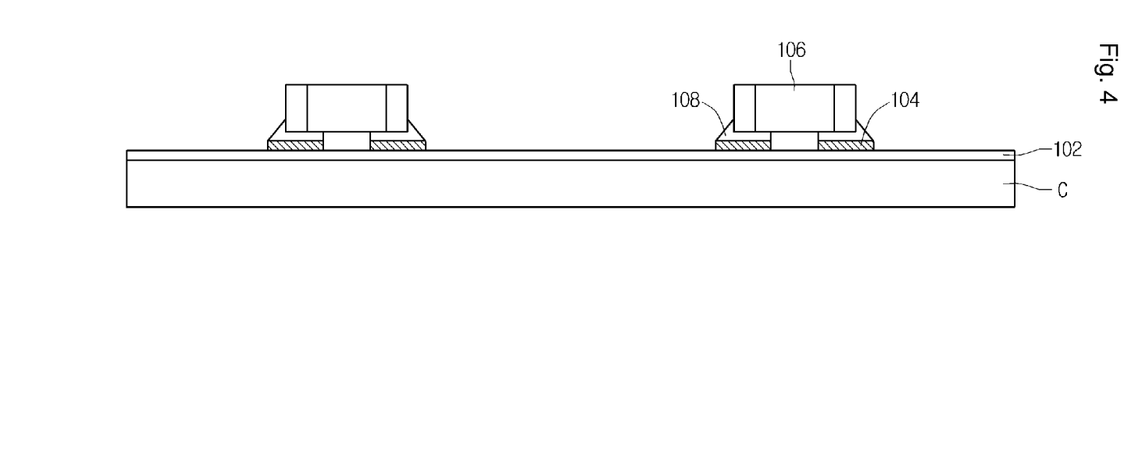

Thereafter, as shown in FIG. 4, the electronic device 106 is attached on the pad 104.

To this end, the adhesive paste 108 is coated on the top surface of the pad 104. The adhesive plate 108 may generally include a solder paste. In addition, the adhesive plate 108 includes metallic powders to ensure electrical conductivity.

The solder paste may include at least one of a low melting-point solder, a high melting-point solder, a solder containing alloy particles, a solder containing a resin, and the combination thereof.

If the electronic device 106 is attached on the pad 104, the adhesive paste 108 may extend from the sidewall of the electronic device 106 to surround the electronic device 106.

Figure 5:
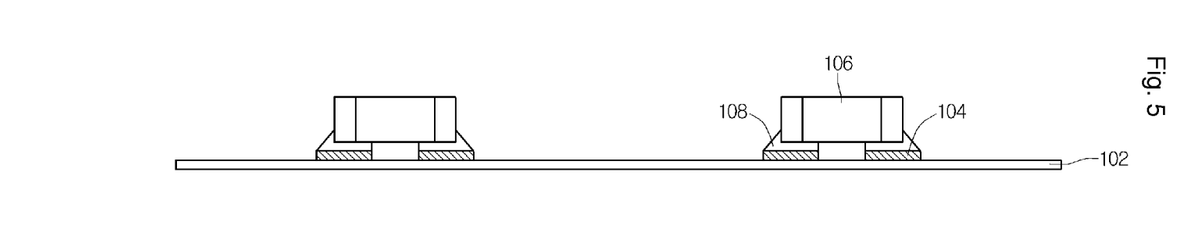

Thereafter, as shown in FIG. 5, if the electronic device 106 is attached on the pad 104, the carrier substrate C is separated from the bottom surface of the metallic layer 102.

In this case, since the foam resin is interposed between the carrier substrate C and the metallic layer 102, the carrier substrate C can be easily separated from the metallic layer 102 due to the foam resin.

Figure 6:
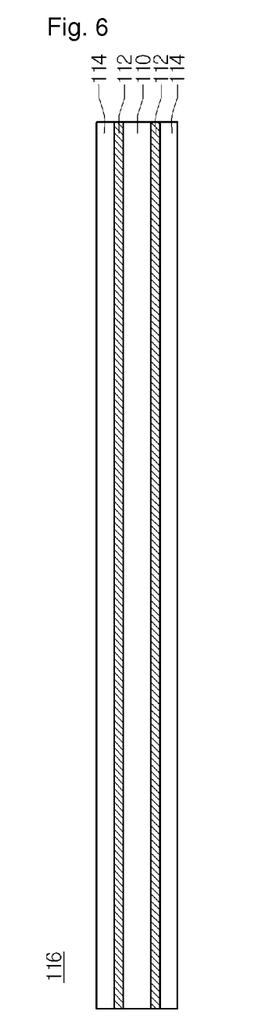

Thereafter, as shown in FIG. 6, the flexible substrate 116 is formed. In order to form the flexible substrate 116, a base material is prepared in order to fabricate the flexible substrate 116.

The base material includes the polyimide layer 110, the first conductive layers 112 on the top and bottom surfaces of the polyimide layer 110, and the first protective layer 114 formed on the top surface of the first conductive layer 112 to protect the surface of the flexible substrate 116.

Figure 7:
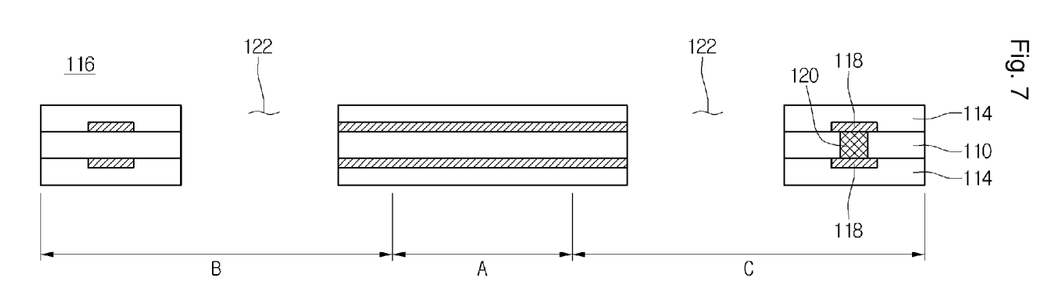

Thereafter, as shown in FIG. 7, the first circuit pattern 114 is formed by etching the first conductive layer 112.

In this case, if the first circuit pattern 114 is formed, an inner connection part 120 may be additionally formed to conduct the first circuit pattern formed on the top surface of the polyimide layer 110 with the first circuit pattern formed on the bottom surface of the polyimide layer 110.

The inner connection part 120 may be formed by forming a via hole (not shown) by perforating the first surface of the polyimide layer 110 and the second surface opposite to the first surface, and filling the conductive material in the via hole.

In this case, the via hole may be formed by performing a mechanical drilling process. In addition, the via hole may be formed by using a laser. When the via hole is formed by using the laser, the polyimide layer 100 may be open by a YAG laser or a Co2 layer.

In this case, the flexible substrate 116 is divided into a flexible region and a rigid region.

In other words, generally, the printed circuit board 100 is coupled with a predetermined machine/device in the state that the printed circuit board 100 is flexibly bent in use.

Therefore, the printed circuit board 100 must have flexibility. However, since the electronic device 106 is embedded in the printed circuit board 100, all regions of the printed circuit board 100 may not have the above flexibility. Accordingly, only a portion of the printed circuit board 100 has flexibility.

Therefore, the electronic device 106 is buried in the rigid region of the flexible substrate 116, and a layer is not laminated on the flexible region. Accordingly, the flexible region of the completed printed circuit board 100 is maintained in the exposed state.

In other words, the flexible region A is formed at the central portion of the flexible substrate 116, the first rigid region B is formed at the left side of the flexible region A, and the second rigid region C is formed at the right side of the flexible region A.

Therefore, the first and second rigid substrate 200 and 300 are formed in the first and second rigid regions B and C, respectively, while exposing the flexible region A.

After the flexible substrate 116 has been fabricated, the flexible substrate 106 is formed on the metallic layer 102 having the electronic device 106 attached thereto.

In this case, since the electronic device 106 is buried in the printed circuit board 100 according to the disclosure as described above, the flexible substrate 116 is formed therein with a cavity 122 corresponding to the position in which the electronic device 106 is formed.

The cavity 122 is formed at a position of the flexible substrate 116 corresponding to the position for the electronic device 106. In other words, since the electronic device 106 is formed in each of the first and second rigid regions B and C as described above, the cavity 122 is formed in each of the first and second rigid regions B and C of the flexible substrate 116.

The cavity 122 may be formed by perforating the first surface of the flexible substrate 116 and the second surface opposite to the first surface.

Figure 8:
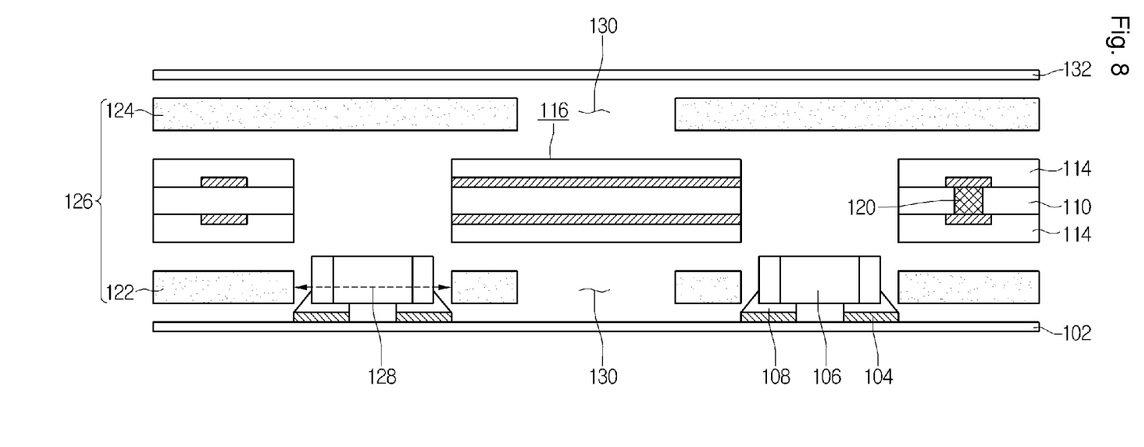
Figure 9:
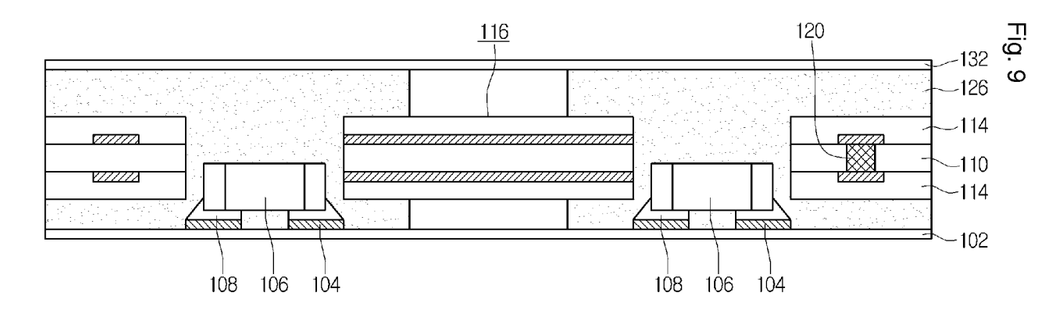

Thereafter, as shown in FIGS. 8 and 9, the flexible substrate 116 is formed on the metallic layer 102 having the electronic device 106 attached thereto.

In this case, the flexible substrate 116 is buried in the first insulating layer 126.

In other words, the flexible substrate 116 and the electronic device 106 are buried in the first insulating layer 126.

After the first insulating layer 126 is maintained in a semi-cured state, the first insulating layer 126 is cured through a curing process, thereby burying the flexible substrate 116 and the electronic device 106.

In this case, the first insulating layer 126 includes the first insulating lamination group having the first opening part 128 corresponding to the position used to form the electronic device 106, the second opening part 130 to expose the flexible region A of the flexible substrate 116, and formed at the lateral side of the electronic device 106, and a second insulating lamination group formed at the upper portion of the first insulating lamination group and the second opening part 130 to expose the flexible region A of the flexible substrate 116.

The second conductive layer 132 is formed on the first insulating layer 126.

As shown in FIG. 9, due to the characteristics in the structure of the first insulating layer 126, the flexible region A of the flexible substrate 116 is not provided thereon with the first insulating layer 126, but continuously exposed.

Figure 10:
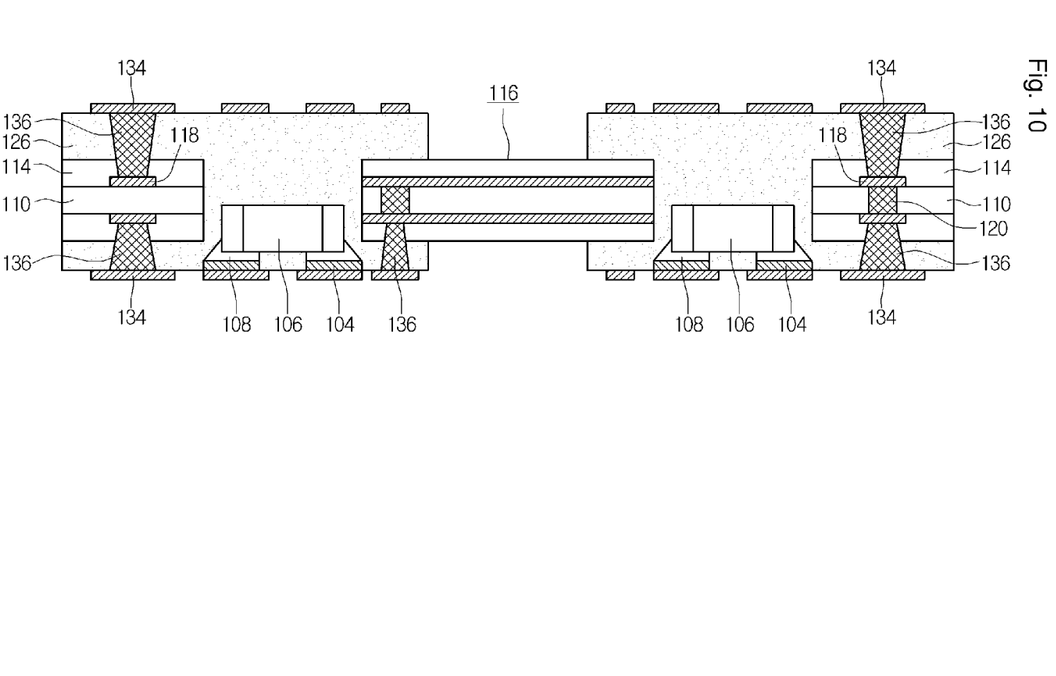

Then, as shown in FIG. 10, the second circuit pattern 134 is formed by etching the second conductive layer 132 formed on the first insulating layer 126 and the metallic layer 102 formed on the bottom surface of the first insulating layer 126. In this case, the second conductive layer 132 formed on the flexible region A of the flexible substrate 116 and the metallic layer 102 formed below the flexible region A are removed to expose the flexible region A.

In addition, the first insulating layer 126 is provided therein with the first connection part 136 to electrically connect the second circuit pattern 134 to the first circuit pattern 118.

The first connection part 136 may be formed by filling a conductive material in a vial hole after the via hole has been formed through a laser process for the first insulating layer 126.

Figure 11:
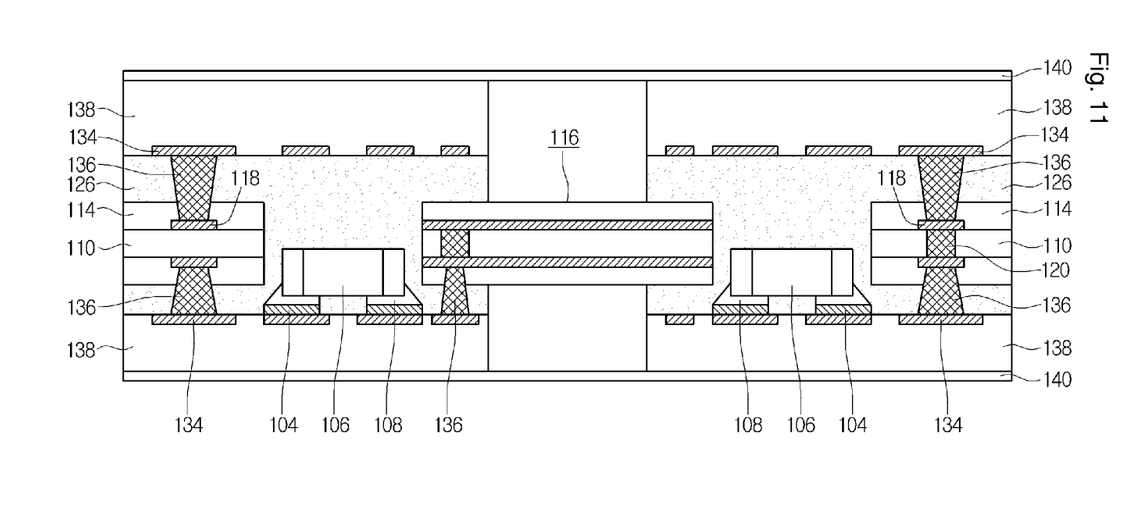

Subsequently, as shown in FIG. 11, the second insulating layers 138 are formed on the top surface and the bottom surface of the first insulating layer 126, respectively.

In this case, the second insulating layers 138 are formed on the top surface and the bottom surface of the first insulating layer 126, respectively, while exposing the flexible region A formed on the flexible substrate 116.

The third conductive layer 140 is formed on one side of the second insulating layer 138.

The third conductive layer 140 may be formed by electroless-plating the metallic material on the second insulating layer 138.

Figure 12:
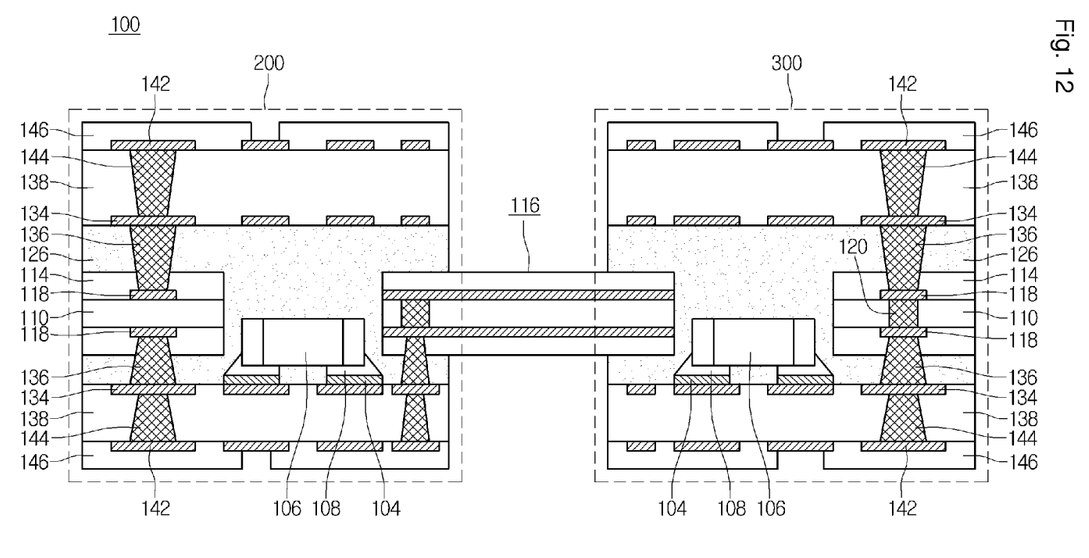

Then, as shown in FIG. 12, the third circuit pattern 143 is formed by etching the third conductive layer 140.

In addition, the second connection part 144 is formed to electrically connect the third circuit pattern 143 to the second circuit pattern 134.

Thereafter, the second protective layer 142 is formed on the second insulating layer 138 to protect the third circuit pattern 143.

Meanwhile, according to the present embodiment, at least one of the first and second rigid regions A and B may be formed on only one of the top and bottom surfaces of the flexible substrate 116. Accordingly, at least one of the first and second rigid substrates 200 and 300 may be formed in the first and second rigid regions A and B formed on at least one of the top and bottom surfaces of the flexible substrate 116.

Meanwhile, although the present embodiment has been described in that the first and second rigid substrates are formed in the rigid regions of the flexible substrate only for the illustrative purpose, one rigid substrate may be formed on the flexible substrate, and divided into a plurality of parts through a predetermined process so that the flexible region of the flexible substrate can be exposed.

As described above, according to the present embodiment, the embedded printed circuit board and the flexible circuit board are integrally formed with each other as electronic products are reduced in size and thickness, so that the thickness of the printed circuit board manufactured in the final stage can be reduced.

In addition, according to the present embodiment, the flexible substrate having a cavity corresponding to the electronic device attached to the inner most part of the flexible substrate is manufactured, so that the manufacturing process of forming the flexible region can be simplified, and the following processes are not required. Accordingly, the present embodiment is applicable to mass production of the printed circuit board.

Although embodiments have been described with reference to a number of illustrative embodiments thereof, it should be understood that numerous other modifications and embodiments can be devised by those skilled in the art that will fall within the spirit and scope of the principles of this disclosure.

The invention claimed is:

1. A printed circuit board comprising: a flexible substrate divided into first, second, and third regions; a first rigid substrate in the first region of the flexible substrate; and a second rigid substrate in the third region of the flexible substrate, wherein a left lateral surface of the flexible substrate is aligned with a left lateral surface of the first rigid substrate, and a right lateral surface of the flexible substrate is aligned with a right lateral surface of the second rigid substrate; and wherein the second region and at least one of the first and third regions are horizontally spaced apart such that a cavity is formed between an outer lateral surface of the at least one of the first and third regions and an outer lateral surface of the second region and wherein the flexible substrate comprises: a polyimide layer; a first conductive layer on a top surface of the polyimide layer; a second conductive layer on a bottom surface of the polyimide layer; a first protective layer on the first conductive layer to protect the first conductive layer; a second protective layer on the second conductive layer to protect the second conductive layer; and a first connection part through the polyimide layer and electrically connecting the first conductive layer to the second conductive layer: a first insulating layer buried in the flexible substrate and disposed on top and bottom surfaces of the flexible substrate, and a second insulating layer disposed on top surface and bottom surface of the first insulating layer: wherein the first insulating layer includes an impregnated substrate containing glass fiber, and the second insulating layer includes an insulating sheet made of only resin; and wherein an electronic device is buried in the at least one of the first and second rigid substrates.

2. The printed circuit board of claim 1, wherein the first region is a left region of the flexible substrate, the third region is a right region of the flexible substrate, and the second region is a central portion of the flexible substrate between the first and third regions.

3. The printed circuit board of claim 1, wherein the at least one of the first and second rigid substrates further comprises:
   a third conductive layer on a top surface and a bottom surface of the second insulating layer; and
   a third protective layer on a surface of the third conductive layer to protect the third conductive layer.

4. The printed circuit board of claim 3, wherein the at least one of the first and second rigid substrates further comprises a second connection part formed through the first and second insulating layers and electrically connecting the first conductive layer or the second conductive layer to the third conductive layer.

5. The printed circuit board of claim 2, wherein the first rigid substrate is formed on top and bottom surfaces of the first region of the flexible substrate, and the second rigid substrate is formed on top and bottom surfaces of the third region of the flexible substrate.

6. The printed circuit board of claim 1, wherein the first insulating layer provided therein with an opening corresponding to a position in which the electronic device is buried.

7. The printed circuit board of claim 1, wherein the flexible substrate is provided at an inner most part in a lamination structure including the flexible substrate, the first rigid substrate, and the second rigid substrate.

8. The printed circuit board of claim 1, wherein the first and second rigid substrates are spaced apart from each other by a predetermined distance while interposing the flexible substrate therebetween.

* * * * *